(12) United States Patent
Shen et al.

(10) Patent No.: US 11,537,171 B2
(45) Date of Patent: Dec. 27, 2022

(54) PORTABLE ELECTRONIC DEVICE

(71) Applicant: Acer Incorporated, New Taipei (TW)

(72) Inventors: Han-Tsung Shen, New Taipei (TW); Shun-Bin Chen, New Taipei (TW)

(73) Assignee: Acer Incorporated, New Taipei (TW)

( * ) Notice: Subject to any disclaimer, the term of this patent is extended or adjusted under 35 U.S.C. 154(b) by 0 days.

(21) Appl. No.: 17/381,203

(22) Filed: Jul. 21, 2021

(65) Prior Publication Data
US 2021/0349502 A1 Nov. 11, 2021

Related U.S. Application Data

(63) Continuation of application No. 16/856,021, filed on Apr. 22, 2020, now Pat. No. 11,112,836.

(30) Foreign Application Priority Data

Nov. 20, 2019 (TW) .............. TW108215344

(51) Int. Cl.
*G06F 1/16* (2006.01)
*F16C 11/04* (2006.01)
*H01H 3/50* (2006.01)
*H05K 5/02* (2006.01)

(52) U.S. Cl.
CPC ............ *G06F 1/1675* (2013.01); *F16C 11/04* (2013.01); *G06F 1/1616* (2013.01); *G06F 1/1624* (2013.01); *G06F 1/1656* (2013.01); *H01H 3/50* (2013.01); *H05K 5/0217* (2013.01)

(58) Field of Classification Search
CPC .... G06F 1/1615; G06F 1/1616; G06F 1/1624; G06F 1/1669
See application file for complete search history.

(56) References Cited

U.S. PATENT DOCUMENTS

| 5,659,307 A * | 8/1997 | Karidis | H01H 13/84 345/169 |
|---|---|---|---|
| 2021/0089082 A1* | 3/2021 | Lee | G06F 1/1624 |
| 2021/0149452 A1* | 5/2021 | Shen | G06F 1/1656 |

* cited by examiner

*Primary Examiner* — Anthony Q Edwards
(74) *Attorney, Agent, or Firm* — JCIPRNET

(57) ABSTRACT

A portable electronic device includes a first body, a second body, a switching mechanism, a spring and a sliding mechanism. The first body includes a base and an input module slidably disposed on the base. The second body is pivoted to the base of the first body. The switching mechanism is disposed at the input module and is configured to switch an engaging relationship between the input module and the base. The spring is disposed at the base and abuts against the input module. The sliding mechanism includes a rack and a gear set engaged with the rack, wherein the rack is mounted to the input module and the gear set is slidably disposed at the base. The input module is pushed by the spring to slide relative to the base, and the rack slides relative to the base synchronously with the input module.

11 Claims, 6 Drawing Sheets

PORTABLE ELECTRONIC DEVICE

CROSS-REFERENCE TO RELATED APPLICATION

This application is a continuation application of and claims the priority benefit of U.S. application Ser. No. 16/856,021, filed on Apr. 22, 2020, now allowed, which claims the priority benefit of Taiwan application serial no. 108215344, filed on Nov. 20, 2019. The entirety of each of the above-mentioned patent applications is hereby incorporated by reference herein and made a part of this specification.

BACKGROUND

Field of the Invention

The invention relates to an electronic device and more particularly, to a portable electronic device.

Description of Related Art

Portable electronic devices, because of being convenient to carry with and having features of instantly sending and receiving and processing information, have become indispensable tools for modern people. Common portable electronic devices include notebook computers, tablet computers and smart cell phones. In comparison with the tablet computers and the smart cell phones, the notebook computers, provided with capabilities such as high computation performance and multiprocessing, draw more attention from business persons, independent creators, game players, engineers, researchers or academic persons.

A common input module of a notebook computer includes a keyboard set and a touch pad, and a location that the input module is disposed is fixed on a machine body. In other words, a common operation mode of the notebook computer tends to be simplex with insufficient flexibility.

SUMMARY

The invention provides a portable electronic device having excellent operational flexibility.

A portable electronic device provided by the invention includes a first body, a second body, a switching mechanism, a spring and a sliding mechanism. The first body includes a base and an input module slidably disposed on the base. The second body is pivoted to the base of the first body. The switching mechanism is disposed at the input module and is configured to switch an engaging relationship between the input module and the base. The spring is disposed at the base and abuts against the input module. The sliding mechanism includes a rack and a gear set engaged with the rack. The rack is mounted to the input module, and the gear set is slidably disposed at the base. The input module is pushed by the spring to slide relative to the base, and the rack slides relative to the base synchronously with the input module.

Based on the above, in the portable electronic device of the invention, the input module can be driven by an elastic force of the spring for a part of the input module to slide out of the base, thereby providing a user with a point of force application to grab or push the input module, which is favorable for the user to pull or push the input module and to switch the portable electronic device to different operation modes. Thus, for the user, the portable electronic device of the invention has excellent operational flexibility and operational convenience.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
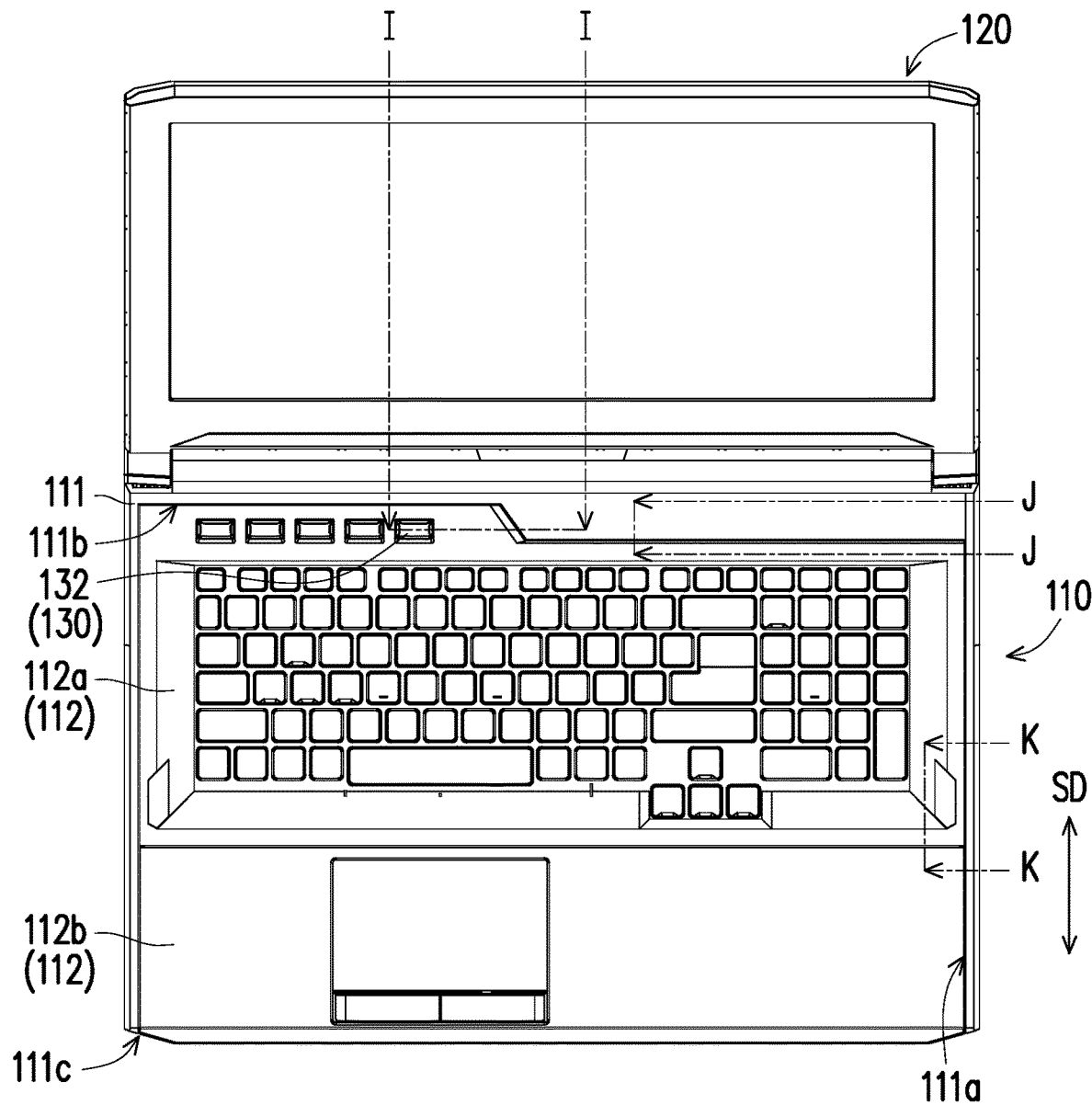
FIG. 1A is a schematic top view showing a portable electronic device in a first state according to an embodiment of the invention.
Figure 1B:
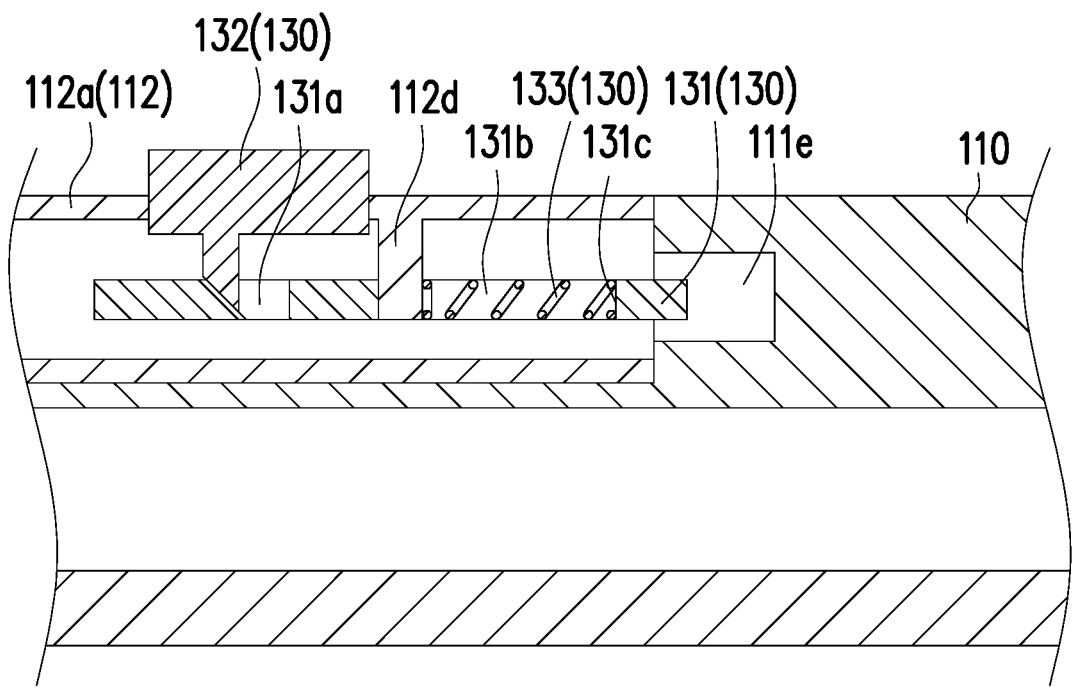
FIG. 1B is a schematic partial cross-sectional view taken along a section line I-I in FIG. 1A.
Figure 1C:
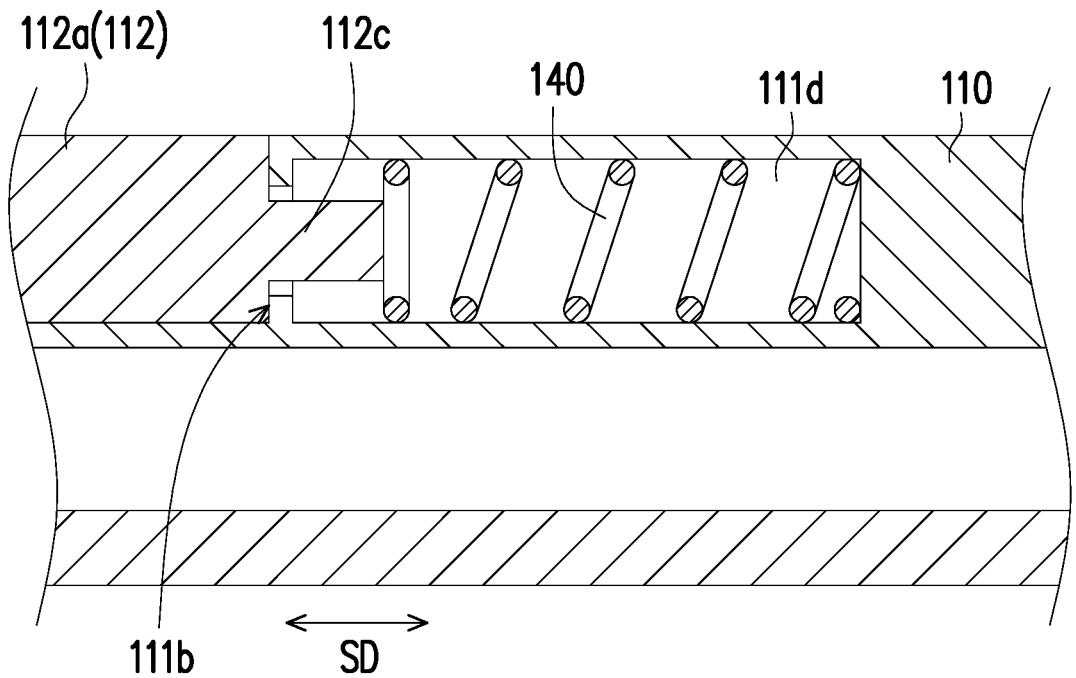
FIG. 1C is a schematic partial cross-sectional view taken along a section line J-J in FIG. 1A.
Figure 1D:
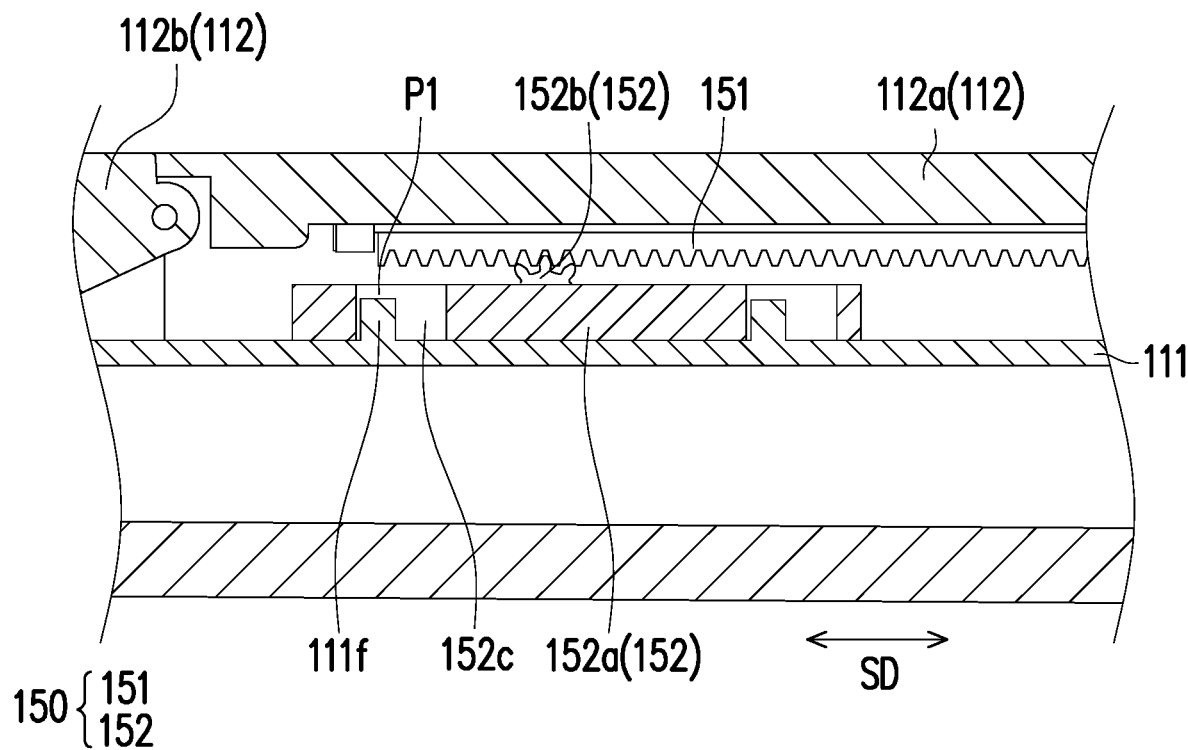
FIG. 1D is a schematic partial cross-sectional view taken along a section line K-K in FIG. 1A.
Figure 1E:
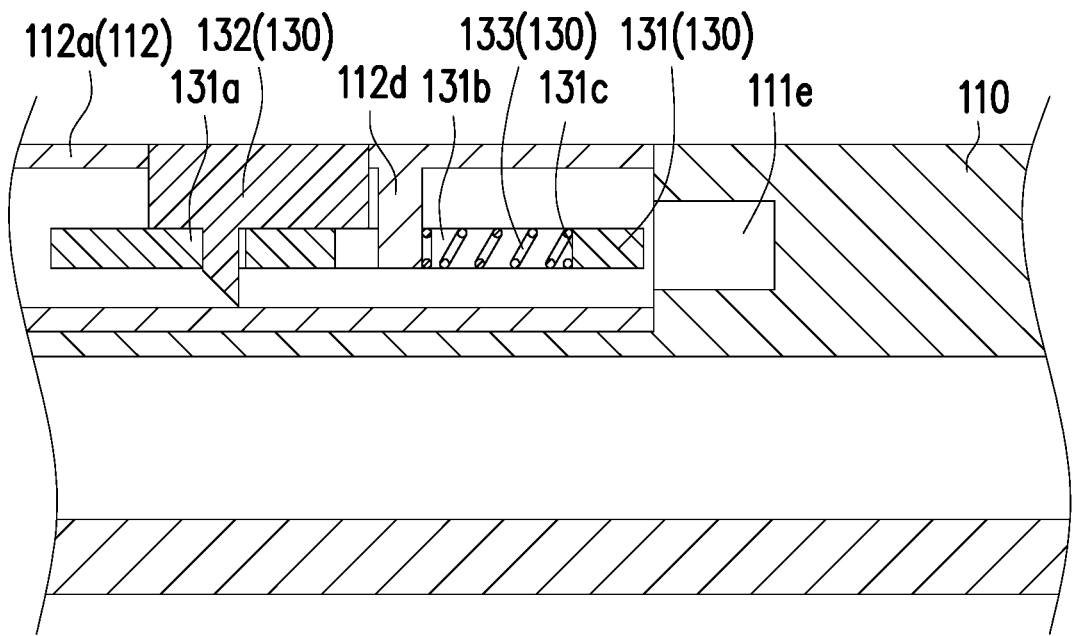
FIG. 1E is a schematic partial cross-sectional view after a switching mechanism depicted in FIG. 1B is operated.

FIG. 1A is a schematic top view showing a portable electronic device in a first state according to an embodiment of the invention. FIG. 1B is a schematic partial cross-sectional view taken along a section line I-I in FIG. 1A. FIG. 1C is a schematic partial cross-sectional view taken along a section line J-J in FIG. 1A. FIG. 1D is a schematic partial cross-sectional view taken along a section line K-K in FIG. 1A. FIG. 1E is a schematic partial cross-sectional view after a switching mechanism depicted in FIG. 1B is operated. Referring to FIG. 1A, in the present embodiment, a portable electronic device 100 may be, for example, a notebook computer or a combination of a tablet computer and a docking station. Specifically, the portable electronic device 100 includes a first body 110 and a second body 120 pivoted to the first body 110, wherein the first body 110 is capable of computation processing, and the second body 120 is capable of displaying. The first body 110 includes a base 111 and an input module 112 slidably disposed on the base 111, wherein the second body 120 is pivoted to the base 111, and the input module 112 may slide relative to the base 111 along a sliding direction SD.

For example, a side of the base 111 that the second body 120 is pivoted to may be considered as a pivot side, and the other side which is opposite to the pivot side may be considered as a movable side. The base 111 has a sliding slot 111a used to accommodate the input module 112 and determine a sliding path of the input module 112. The sliding slot 111a has a side wall 111b and an exit 111c opposite to the side wall 111b, wherein the side wall 111b is close to the pivot side of the base 111, and the exit 111c is located at the movable side of the base 111. In a first state, the input module 112 abuts against the side wall 111b and does not exceed the movable side of the base 111 from the exit 111c.

On the other hand, the input module 112 includes a first operating portion 112a and a second operating portion 112b adjacent to the first operating portion 112a. In the first state, the first operating portion 112a abuts against the side wall 111b, and the second operating portion 112b is close to the exit 111c, but the second operating portion 112b does not exceed the movable side of the base 111 from the exit 111c. For example, the first operating portion 112a and the second operating portion 112b may be a combination of a keyboard set and a touch pad.

Referring to FIG. 1A to FIG. 1D, in the present embodiment, the portable electronic device 100 further includes a switching mechanism 130, a spring 140 and a sliding mechanism 150. The switching mechanism 130 is disposed at the first operating portion 112a of the input module 112, and the spring 140 is disposed at the base 111 and abuts against the first operating portion 112a of the input module 112. In the first state, the first operating portion 112a of the input module 112 is engaged with the base 111 through the switching mechanism 130, wherein the spring 140 is compressed by the first operating portion 112a of the input module 112, and the compressed spring 140 stores elastic potential energy.

For example, the base 111 has a recess 111d in communication with the sliding slot 111a, and the spring 140 is located in the recess 111d. On the other hand, the first operating portion 112a of the input module 112 has a positioning protrusion 112c configured to be inserted in the recess 111d. In the first state, the positioning protrusion 112c is inserted in the recess 111d, which is used to abut against and compress the spring 140.

Specifically, the switching mechanism 130 includes an engaging member 131 and a button 132, wherein the engaging member 131 is slidably disposed at the first operating portion 112a of the input module 112, and the button 132 includes a pressing portion exposed from the first operating portion 112a of the input module 112 for a user to operate conveniently. On the other hand, the button 132 further includes a touch portion located between the first operating portion 112a of the input module 112 and the base 111 to contact the engaging member 131. The base 111 has a locking slot 111e in communication with the sliding slot 111a, and in the first state, the engaging member 131 is engaged with the locking slot 111e to prevent the input module 112 from arbitrarily siding relative to the base 111.

On the other hand, the sliding mechanism 150 includes a rack 151 and a gear set 152 engaged with the rack 151, wherein the rack 151 is mounted to the first operating portion 112a of the input module 112, and an extension direction of the rack 151 is parallel to the sliding direction SD. The gear set 152 is slidably disposed at the base 111. Based on an engaging relationship between the rack 151 and the gear set 152, the gear set 152 may slide along with the input module 112 and the rack 151 relative to the base 111, but the gear set 152 is only allowed to slide relative to the base 111 within a specific sliding stroke.

In the present embodiment, the gear set 152 includes a gear base 152a and a gear 152b pivoted to the gear base 152a, and the gear 152b is engaged with the rack 151. Specifically, the gear base 152a is slidably disposed at the base 111, wherein the base 111 has a limiting post 111f, and the gear base 152a has a sliding slot 152c. The limiting post 111f is inserted in the sliding slot 152c, so as to limit the sliding stroke that the gear base 152 slides relative to the base 111. In the first state, the limiting post 111f is located at a first stroke end point P1 of the sliding slot 15c.

Figure 2A:
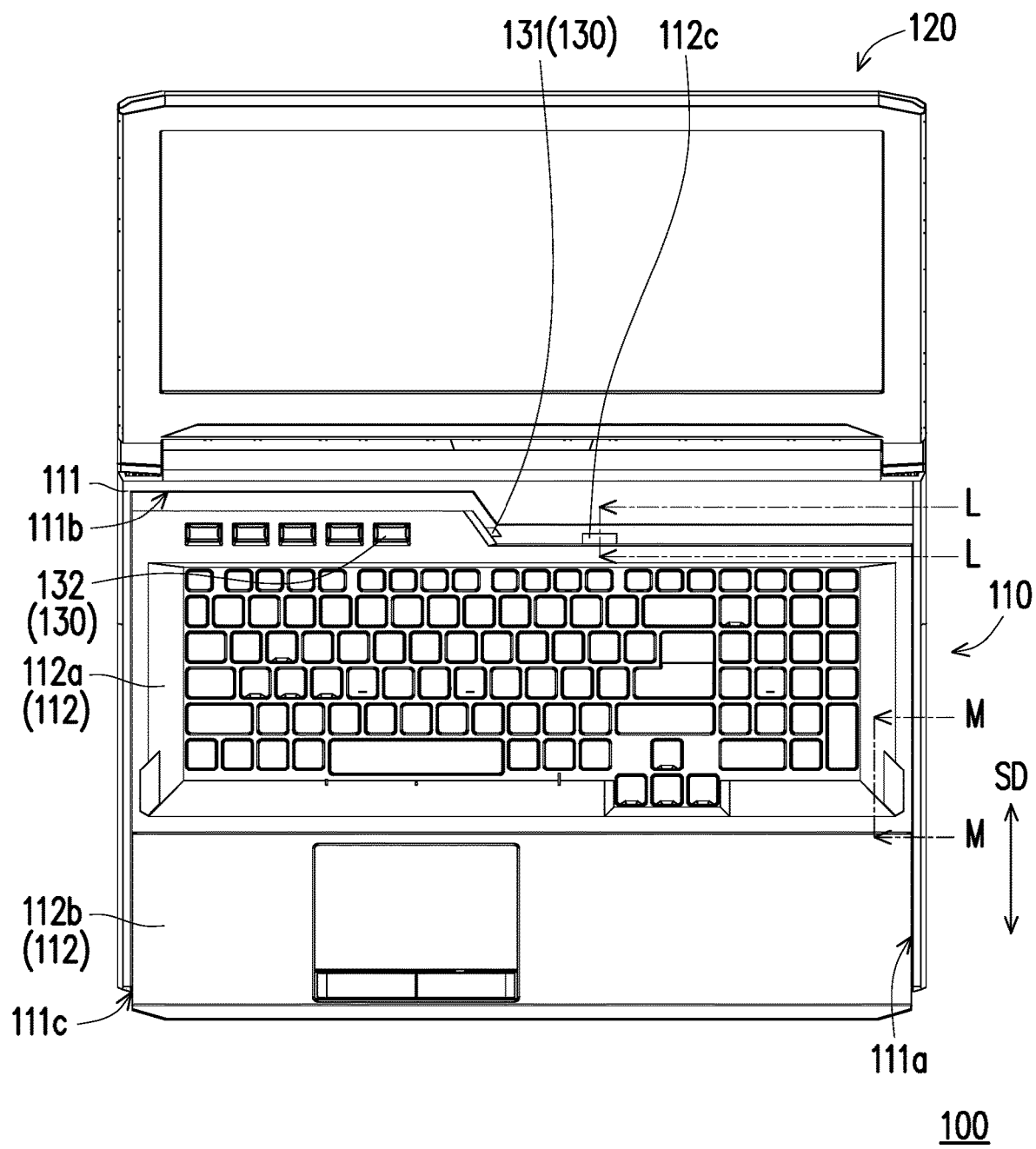
FIG. 2A is a schematic top view showing the portable electronic device in a second state according to an embodiment of the invention.
Figure 2B:
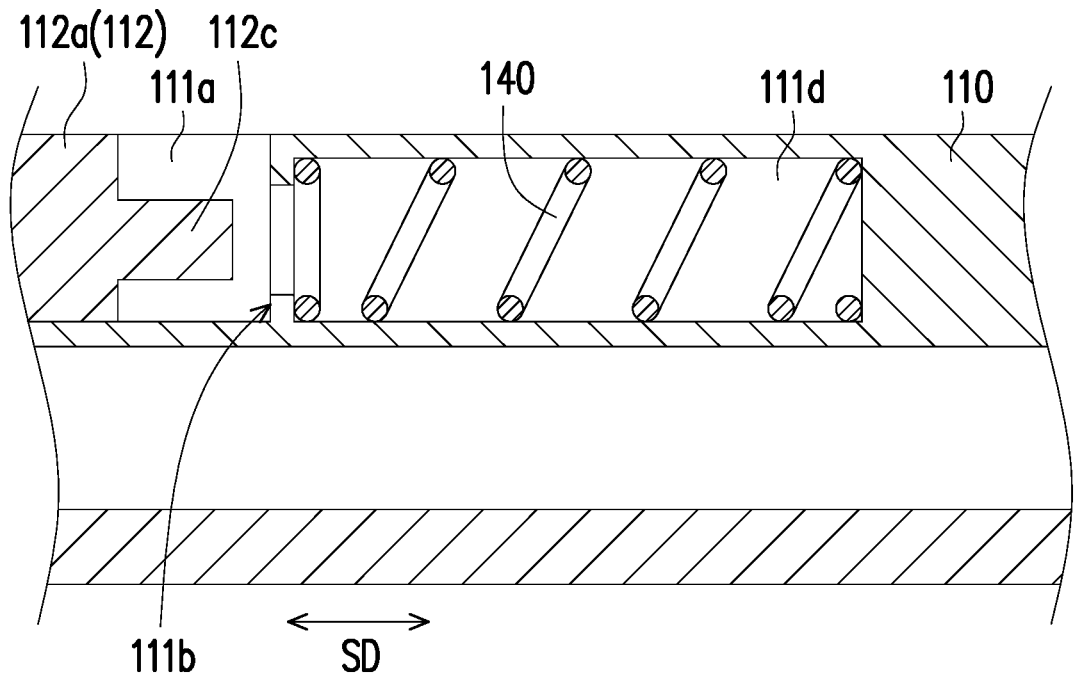
FIG. 2B is a schematic partial cross-sectional view taken along a section line L-L in FIG. 2A.
Figure 2C:
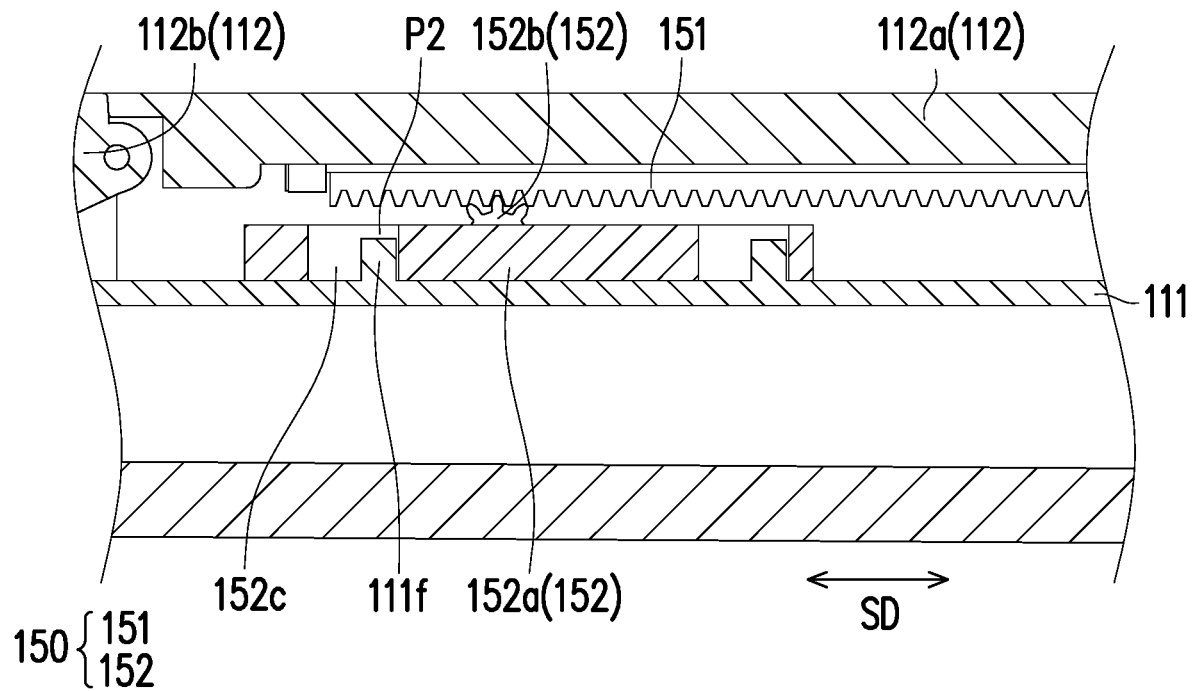
FIG. 2C is a schematic partial cross-sectional view taken along a section line M-M in FIG. 2A.

FIG. 2A is a schematic top view showing the portable electronic device in a second state according to an embodiment of the invention. FIG. 2B is a schematic partial cross-sectional view taken along a section line L-L in FIG. 2A. FIG. 2C is a schematic partial cross-sectional view taken along a section line M-M in FIG. 2A. Referring to FIG. 1E to FIG. 2B, once the engaging relationship between the first operating portion 112a of the input module 112 and the base 111 is disengaged by the switching mechanism 130, the elastic potential energy of the spring 140 may be released to push the positioning protrusion 112c, such that the input module 112 slides relative to the base 111 along the sliding direction SD, and a part of the second operating portion 112b slides out of the base 111 from the exit 111c.

In this circumstance, the positioning protrusion 112c is moved out of the recess 111d, and a sufficiently large gap may be created between the first operating portion 112a and the side wall 111b for the user to put a finger into the gap and push the first operating portion 112a, such that the input module 112 sides relative to the base 111. Alternatively, the user's finger may pull the part of the second operating portion 112b which slides out of the base 111, such that the input module 112 sides relative to the base 111.

Specifically, when the user presses the button 132, the button 132 which is moved downward pushes the engaging member 131 for the engaging member 131 to slide relative to the first operating portion 112a and move out of the locking slot 111e, so as to disengage the engaging relationship between the first operating portion 112a of the input module 112 and the base 111. In order to ensure a touch relationship between the button 132 and the engaging member 131, the engaging member 131 has a first slot 131a, and a part of the button 132 is located in the first slot 131a. For example, the button 132 may not only drive the engaging member 131 to slide, but also be assembled with other function buttons (e.g., a turbo key).

On the other hand, the switching mechanism 130 further includes a restoring member 133. The restoring member 133 may be a spring, and two ends of the restoring member 133 are respectively connected with the first operating portion 112a of the input module 112 and the engaging member 131. For example, the engaging member 131 further has a second slot 131b, and the first operating portion 112a of the input module 112 has a limit protrusion 112d inserted in the second slot 13 1b. The two ends of the restoring member 133 are respectively connected with the limit protrusion 112d and an inner wall surface 131c of the second slot 131b. When the engaging member 131 is pushed by the button 132 to move the engaging member 131 out of the locking slot 111e, the inner wall surface 131c of the second slot 131b moves toward the limit protrusion 112d to compress the restoring member 133. When the engaging member 131 is no longer pushed by the button 132, the inner wall surface 131c of the second slot 131b is pushed by an elastic restoring force of the restoring member 133, such that the engaging member 131 slides back to its initial location. It may be understood that the restoring member 133 may also be used to ensure that the engaging member 131 is engaged with the locking slot 111e.

Referring to FIG. 2A to FIG. 2C, when the input module 112 is pushed by the spring 140 to slide relative to the base 111 along the sliding direction SD for the part of the second operating portion 121b to side out of the base from the exit 110c, the gear set 152 may slide along with the input module 112 and the rack 151 relative to the base 111, and the gear set 152 does not stop sliding along with the input module 112 and the rack 151 relative to the base 111 until the limiting post 111f moves to a second stroke end point P2 of the sliding slot 152c.

Figure 3:
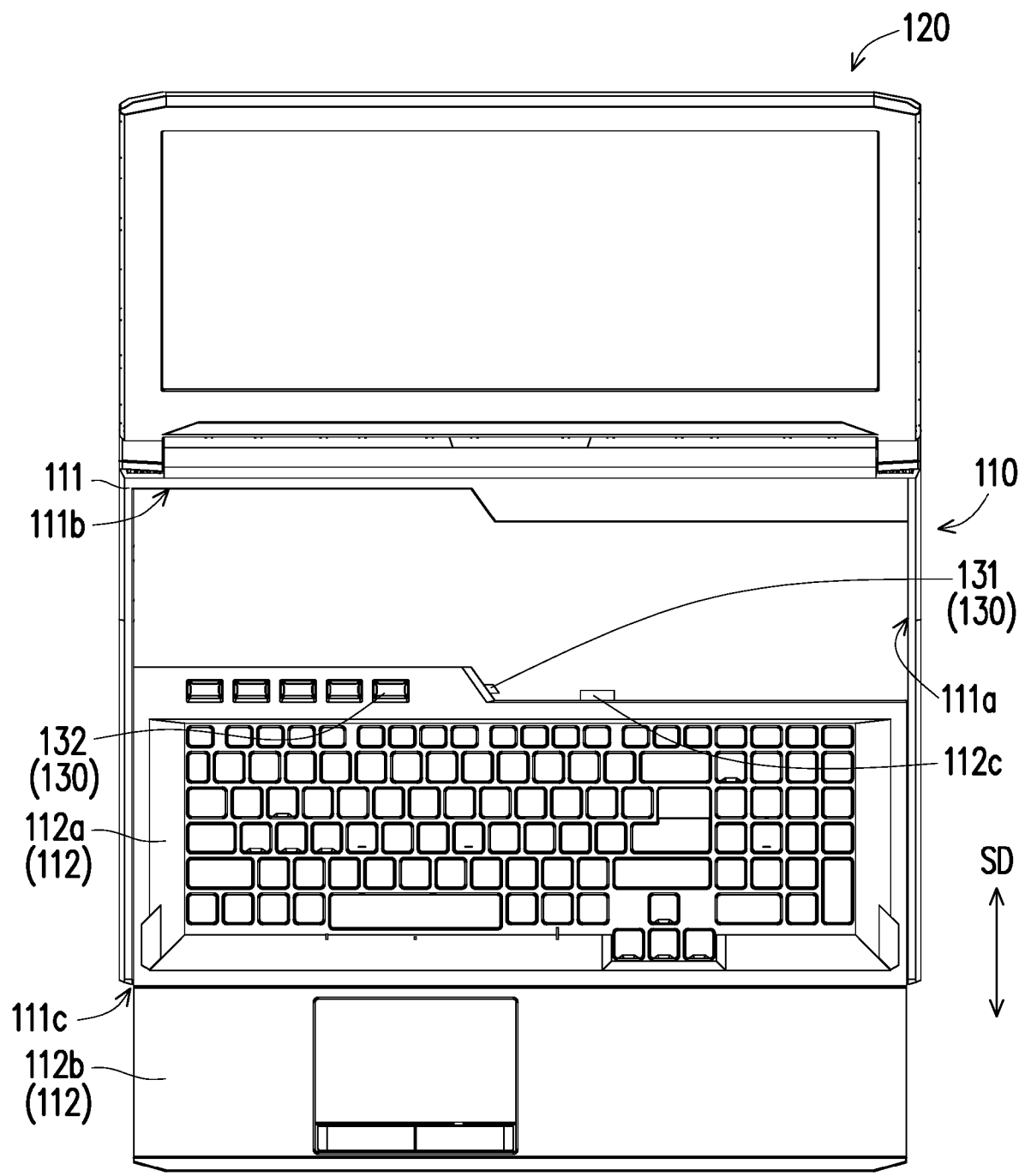
FIG. 3 is a schematic top view showing the portable electronic device in a third state according to an embodiment of the invention.

FIG. 3 is a schematic top view showing the portable electronic device in a third state according to an embodiment of the invention. Referring to FIG. 2A, FIG. 2C and FIG. 3, after the part of the second operating portion 112b slides out of the base 111 from the exit 111c, the user may push the first operating portion 112a or pull the second operating portion 112b, such that the input module 112 slides relative to the base 111 through the cooperation of the rack 151 and the gear 152b, and the entire second operating portion 112b slides out of the base 111. In this circumstance, the second operating portion 112b may tilt with respect to the first operating portion 112a to provide the user with different operation modes. On the other hand, the input module 112 sides relative to the base 111 and moves away from a location directly above a heat dissipation portion of the base 111, such that the heat dissipation portion is exposed to the outside, and a heat dissipation efficiency of the portable electronic device 100 is increased.

Based on the above, in the portable electronic device of the invention, the input module can be driven by the elastic force for the input module to partially slide out of the base, thereby providing the user with a point of force application to grab or push the input module, which is favorable for the user to pull or push the input module and to switch the portable electronic device to different operation modes. Thus, for the user, the portable electronic device of the invention has excellent operational flexibility and operational convenience. On the other hand, the user can disengage the engaging relationship between the input module and the base, as well as push the input module by the spring only by pressing the button. Thus, the operation method can be easy and intuitive.

Although the present invention has been described with reference to the embodiments thereof, it will be apparent to one of the ordinary skills in the art that modifications to the described embodiments may be made without departing from the spirit of the invention. Accordingly, the scope of the invention will be defined by the attached claims not by the above detailed description.

What is claimed is:

1. A portable electronic device, comprising:
    a first body, comprising a base and an input module slidably disposed on the base;
    a second body, pivoted to the base of the first body;
    a switching mechanism, disposed at the input module and configured to switch an engaging relationship between the input module and the base;
    a spring, disposed at the base and abuts against the input module; and
    a sliding mechanism, comprising a rack and a gear set engaged with the rack, wherein the rack is mounted to the input module, and the gear set is slidably disposed at the base, the input module is pushed by the spring to slide relative to the base, and the rack slides relative to the base synchronously with the input module.

2. The portable electronic device according to claim 1, wherein the input module comprises a first operating portion and a second operating portion, the switching mechanism is disposed at the first operating portion, and the spring abuts against the first operating portion.

3. The portable electronic device according to claim 1, wherein the switching mechanism comprises an engaging member and a button, the base has a locking slot, and the engaging member is engaged with the locking slot, wherein the button contacts the engaging member and configured to drive the engaging member to move out of the locking slot.

4. The portable electronic device according to claim 3, wherein the switching mechanism further comprises a restoring member, and two ends of the restoring member are respectively connected with the input module and the engaging member.

5. The portable electronic device according to claim 4, wherein the engaging member has a first slot, and a part of the button is located in the first slot.

6. The portable electronic device according to claim 5, wherein the engaging member has a second slot, the input module has a limit protrusion inserted in the second slot, and the two ends of the restoring member are respectively connected with the limit protrusion and an inner wall surface of the second slot.

7. The portable electronic device according to claim 1, wherein the base has a recess, the spring is located in the recess, the input module has a positioning protrusion inserted in the recess, and the positioning protrusion abuts against the spring.

8. The portable electronic device according to claim 1, wherein the gear set comprises a gear base and a gear pivoted to the gear base, the gear is engaged with the rack, and the gear base is slidably disposed at the base.

9. The portable electronic device according to claim 8, wherein the base has a limiting post, the gear base has a sliding slot, and the limiting post is inserted in the sliding slot.

10. The portable electronic device according to claim 1, wherein the input module is engaged with the base, and the spring is compressed by the input module.

11. The portable electronic device according to claim 1, wherein the gear set slides along with the input module and the rack relative to the base along a same direction.

* * * * *